(12) United States Patent
Takada et al.

(10) Patent No.: US 7,554,054 B2
(45) Date of Patent: Jun. 30, 2009

(54) HIGH-FREQUENCY HEATING DEVICE, SEMICONDUCTOR MANUFACTURING DEVICE, AND LIGHT SOURCE DEVICE

(75) Inventors: Yutaka Takada, Nagano (JP); Satoshi Fujii, Hyogo (JP)

(73) Assignee: Seiko Epson Corporation (JP)

( * ) Notice: Subject to any disclaimer, the term of this patent is extended or adjusted under 35 U.S.C. 154(b) by 563 days.

(21) Appl. No.: 11/237,114

(22) Filed: Sep. 28, 2005

(65) Prior Publication Data

US 2006/0081624 A1   Apr. 20, 2006

(30) Foreign Application Priority Data

Oct. 1, 2004   (JP)   ............... 2004-289638
Jul. 22, 2005   (JP)   ............... 2005-212297

(51) Int. Cl.
   *B23K 10/00*   (2006.01)
(52) U.S. Cl. ............... 219/121.43; 219/121.52; 219/121.4; 315/111.81
(58) Field of Classification Search ............... 219/121.4, 219/121.41, 121.43, 121.52; 315/111.81, 315/111.21; 118/723 MW, 723 R; 204/298.37, 204/298.38; 156/345.36, 345.41, 345.44
See application file for complete search history.

(56) References Cited

U.S. PATENT DOCUMENTS

| | | |
|---|---|---|
| 3,943,403 A | 3/1976 | Haugsjaa et al. |
| 3,953,702 A | 4/1976 | Bickel et al. |
| 4,070,603 A | 1/1978 | Regan et al. |
| 4,196,332 A | 4/1980 | MacKay et al. |
| 4,210,795 A | 7/1980 | Lentz |
| 4,460,814 A | 7/1984 | Diesch et al. |
| 4,504,718 A | 3/1985 | Okatsuka et al. |
| 4,871,984 A | 10/1989 | Laton et al. |
| 4,882,462 A | 11/1989 | Husslein et al. |
| 5,109,203 A | 4/1992 | Zucker et al. |
| 5,280,217 A | 1/1994 | Lapatovich et al. |
| 5,313,144 A | 5/1994 | Butler et al. |
| 5,497,726 A | 3/1996 | Shikata et al. |
| 5,961,871 A | 10/1999 | Bible et al. |
| 6,111,237 A | 8/2000 | Paustian |
| 6,225,756 B1 | 5/2001 | Gitsevich |

(Continued)

FOREIGN PATENT DOCUMENTS

EP   0 432 573   6/1991

(Continued)

OTHER PUBLICATIONS

Communication from Korean Patent Office regarding counterpart application.

(Continued)

*Primary Examiner*—Mark H Paschall
(74) *Attorney, Agent, or Firm*—Harness, Dickey & Pierce, P.L.C.

(57) ABSTRACT

A high-frequency heating device including: a solid-state oscillator that generates a microwave; an amplifier that amplifies the microwave generated by the solid-state oscillator; an isolator that is connected to a stage subsequent to the amplifier and blocks a reflected wave directed from an object exposed with the microwave; an antenna that irradiates the microwave toward the object; and a metal cavity that traps therein the microwave irradiated to the object.

10 Claims, 10 Drawing Sheets

U.S. PATENT DOCUMENTS

| | | |
|---|---|---|
| 2002/0189664 A1 * | 12/2002 | Ishihara .................. 136/258 |
| 2003/0136519 A1 | 7/2003 | Sumida |
| 2004/0045508 A1 * | 3/2004 | Tamagaki et al. ... 118/723 MW |
| 2004/0189147 A1 | 9/2004 | Ito |

FOREIGN PATENT DOCUMENTS

| | | |
|---|---|---|
| EP | 1 146 592 | 10/2001 |
| JP | 03-194893 | 8/1991 |
| JP | 07-057702 | 3/1995 |
| JP | 07-307105 | 11/1995 |
| JP | 08-007610 | 1/1996 |
| JP | 09-245746 | 9/1997 |
| JP | 2001-202923 | 7/2001 |
| JP | 2001-255589 | 9/2001 |
| JP | 2001-266803 | 9/2001 |
| JP | 2001-338620 | 12/2001 |
| JP | 2001-351791 | 12/2001 |
| JP | 2002-203523 | 7/2002 |
| JP | 2002-246167 | 8/2002 |
| JP | 2002-280191 | 9/2002 |
| JP | 2003-168398 | 6/2003 |
| JP | 2003-178605 | 6/2003 |
| JP | 2003-249197 | 9/2003 |
| JP | 2004-79369 | 3/2004 |
| JP | 2004-87360 | 3/2004 |
| JP | 2004-87434 | 3/2004 |
| JP | 2005-079088 | 3/2005 |
| JP | 2005-129408 | 5/2005 |
| JP | 2005-174928 | 6/2005 |
| JP | 2007-115547 | 5/2007 |

OTHER PUBLICATIONS

Communication from European Patent Office regarding corresponding application.

Communication from European Patent Office re: related application.

"Questions and Answers on a Power Amplifier", http://www.chronix.co.jp/chronix/syouhin/chronix/que-ans.html, Chronix Ltd. (2004) and English translation thereof.

Masashi Kando, "Application of Microwave Plasma to Light Sources Focusing on Antenna-Excited Microwave Discharge Lamps", Department of Electrical and Electronic Engineering, Shizuoka University, pp. 367-374 (2008). (No Translation—Make of Record Only).

* cited by examiner

HIGH-FREQUENCY HEATING DEVICE, SEMICONDUCTOR MANUFACTURING DEVICE, AND LIGHT SOURCE DEVICE

RELATED APPLICATIONS

This application claims priority to Japanese Patent Application Nos. 2004-289638 filed Oct. 1, 2004 and 2005-212297 filed Jul. 22, 2005 which are hereby expressly incorporated by reference herein in their entirety.

BACKGROUND

1. Technical Field

The present invention relates to high-frequency heating devices, semiconductor manufacturing devices, light source devices, and more specifically, to those suitably used with a method of microwave generation using a solid-state oscillator.

2. Related Art

With related-art high-frequency heating devices, substances such as food are heated utilizing the vibration of water molecules at the time of microwave irradiation. Semiconductor manufacturing devices generate plasmas utilizing pumping and ionization of gas at the time of microwave irradiation.

For generation of microwaves, a kind of vacuum tube such as a magnetron oscillator (hereinafter, magnetron) or klystron oscillator is widely used since each is capable of efficiently generating a high-frequency output.

Using the magnetron in a heating device, for example, however, causes a frequency fluctuation problem in that intermittent microwave operation and a load-fluctuating heating object cause the oscillation frequency to fluctuate due to reflected wave returning to an oscillator tube, a useful life problem of making a filament unavailable due to wire breakage, an unwanted emission problem in that due to unwanted emission from the magnetron, the interference wave make radio communications equipment such as Bluetooth and WLAN used in an ISM band unavailable for communications, and other problems as well.

Such problems are observed not only in heating devices but also in radar equipment, medical equipment, semiconductor manufacturing devices, and other microwave application equipment using a magnetron. To solve such problems, for example, JP-A-3-194893 and JP-A-2002-246167 disclose a device with a solid-state high-frequency oscillator that does not use a magnetron of a vacuum tube type.

The issue here is that the solid-state high-frequency oscillators disclosed in JP-A-3-194893 and JP-A-2002-246167 merely amplify a high frequency coming from the oscillator using an amplifier configured by a transistor, and no specific method of generating a high frequency microwave band is disclosed.

SUMMARY

In consideration of the above, an advantage of the invention is to provide a high-frequency heating device, a semiconductor manufacturing device, and a light source device, all which are capable of generating a microwaves with high signal purity while achieving a size reduction and a life cycle increase thereof.

In order to achieve the above-described advantage, according to a high-frequency heating device of an aspect of the present invention, the configuration includes a solid-state oscillator that generates a microwave; an amplifier that amplifies the microwave generated by the solid-state oscillator; an isolator that is connected to a stage subsequent to the amplifier, and blocks a reflected wave directed from an object exposed with the microwave; an antenna that irradiates the microwave toward the object; and a metal cavity that traps therein the microwave irradiated to the object.

This enables generating a high frequency microwave band without using a magnetron. Therefore, there is no longer a need to use a vacuum tube or a filament to generate a microwave, thereby enabling a size reduction and life cycle increase of a high-frequency heating device, and suppression of unwanted emission. Accordingly, it enables suppression of adverse effects with respect to radio communication equipment such as Bluetooth, Zigbee, HomeRF, and WLAN used in an ISM band. Moreover, through connection of an isolator to a stage subsequent to an amplifier, it becomes possible to prevent a reflected wave directed from an object exposed with the microwave from returning to the amplifier, enabling the derivation of any needed microwave power while protecting the amplifier from damage.

Further, according to a high-frequency heating device in another aspect of the invention, the configuration includes: a solid-state oscillator whose surface acoustic wave resonator is incorporated in an oscillator loop, and generates a microwave; an amplifier that amplifies the microwave generated by the solid-state oscillator; an isolator that is connected to the stage subsequent to the amplifier, and blocks a reflected wave directed from an object exposed with the microwave; an antenna that irradiates the microwave toward the object; and a metal cavity that traps therein the microwave irradiated to the-object.

This enables generating a microwave using a surface acoustic wave resonator, thereby easing direct oscillation in a GHz band, providing low phase noise characteristics, and deriving high-precision high-quality oscillation signals of a base frequency. Therefore, there is no longer a need to use a magnetron to generate a microwave, thereby enabling a size reduction and life cycle increase of a high-frequency heating device, and suppression of unwanted emission to control communications failures.

According to a high-frequency heating device in still another aspect of the invention, the surface acoustic wave resonator includes: a thin-film piezoelectric layer placed over a diamond layer or a diamond-like carbon film layer; and an IDT electrode formed on the thin-film piezoelectric layer.

This enables the increase of the propagation speed of surface acoustic wave, thereby allowing oscillation at higher frequencies, making the electrode width of the surface acoustic wave resonator larger compared with other substrate materials, increasing the resistance to electric power, and reducing the frequency fluctuations even with a temperature change. Accordingly, a microwave oscillator source can be implemented with higher precision.

According to a high-frequency heating device in still another aspect of the invention, the surface acoustic wave resonator is provided with: a thin-film piezoelectric layer that is placed over a monocrystalline diamond layer or a hard carbon film having an elastic constant close to that of polycrystalline diamond; an IDT electrode formed on the thin-film piezoelectric layer; and a silicon oxide film formed on the IDT electrode.

With such a configuration, the silicon oxide film becomes able to control temperature compensation with respect to the thin-film piezoelectric layer. This thus helps suppress the frequency fluctuations occurring to a SAW oscillator as a result of temperature variation, thereby stabilizing the microwave output.

According to a high-frequency heating device in still another aspect of the present invention, the configuration further includes: an equal divider that equally divides an electric power in the oscillator loop for output to the outside of the oscillator loop; and a phase shifter that varies the phase in the oscillator loop.

This allows frequency modulation of the microwave. Accordingly, this prevents heat irregularities, and reduces the peak level of electromagnetic interference (EMI), thereby improving the electromagnetic compatibility (EMC).

According to a high-frequency heating device in still another aspect of the invention, the antenna is a unidirectional planar antenna or a phased array antenna.

This favorably reduces the size of the antenna, and thus the metal cavity can be reduced in size and weight. Moreover, by providing unidirectionality to the antenna, the directivity thereof can be closely matched to the object in the metal cavity so that the microwave can be efficiency irradiated to the object.

Using the phased array antenna allows electrical phase control, and thus the directivity can be changed at a high speed. Moreover, in combination with a voltage-control SAW oscillator having a high degree of high-speed modulation, the antenna can afford better control over the high-speed directivity so that the temperature-varying object can be appropriately heated.

According to a high-frequency heating device in still another aspect of the invention, the configuration further includes a progressive wave/reflected wave detection unit that detects progressive wave power to be directed to the antenna, and reflected wave power to be returned from the antenna; and an operation unit that exercises control over the microwave coming from the antenna based on the progressive wave power and the reflected wave power detected by the progressive wave/reflected wave detection unit.

This configuration enables control to be exercised control over the microwave coming from the antenna while monitoring the reflected wave power, which varies depending on the object's position, size, temperature, permittivity, conductivity, and others. Accordingly, factors such as the object's position, size, temperature, permittivity, conductivity, and others are used as a basis to apply power control so as to help the object efficiently absorb the microwave. As such, the object can be heated while measures are taken to ensure power conservation and short time operation.

According to a high-frequency heating device in still another aspect of the invention, based on the progressive wave power and the reflected wave power detected by the progressive wave/reflected wave detection unit, the operation unit exercises control over at least one of an oscillation frequency of the solid-state oscillator, a presence or absence of an output of the solid-state oscillator, or an amplification level of the amplifier.

In this manner, the progressive wave power and the reflected wave power can be used as a basis to change the amplification level of the amplifier or heat the object. The amplification level is changed so as to maximize the efficiency or minimize the time, and the object is heated so as to maximize the efficiency, or minimize the time or power through FSK modulation or ASK modulation applied to the microwave output.

According to a high-frequency heating device in still another aspect of the invention, the configuration further includes a matching unit that is placed at a stage subsequent to the progressive wave/reflected wave detection unit for impedance matching with a load, and the operation unit exercises control over the matching unit based on the progressive wave power and the reflected wave power detected by the progressive wave/reflected wave detection unit.

This enables appropriately adjusting the impedance matching with the object that is to be exposed with the microwave. As a result, the reflected wave power can be reduced so that the microwave can be absorbed into the object with efficiency.

According to a high-frequency heating device in still another aspect of the invention, the antenna is plurally provided in the metal cavity, and a power splitter that controls power allocation to the antenna is placed at a stage subsequent to the isolator.

This enables uniform irradiation of the microwave into the metal cavity so that the object is uniformly heated to a greater degree.

According to a semiconductor manufacturing device in an aspect of the invention, the configuration includes: a chamber that isolates a process object; a gas guiding unit that guides a reaction gas into the chamber; a solid-state oscillator that generates a microwave; an amplifier that amplifies the microwave generated by the solid-state oscillator; an isolator that is connected to a stage subsequent to the amplifier and blocks a reflected wave directed from an object exposed with the microwave; a plasma generation unit that controls plasma generation in the chamber by irradiating the microwave to the reaction gas; and an evacuation unit that evacuates the chamber.

This enables generating a high frequency microwave band without using a magnetron. This thus enables a size reduction and life cycle increase of a semiconductor manufacturing device, and prevents a reflected wave directed from an object exposed with the microwave from returning to the amplifier so that the amplifier is protected from damage.

According to a semiconductor manufacturing device in another aspect of the invention, the configuration includes: a chamber that isolates a process object; a gas guiding unit that guides a reaction gas into the chamber; a solid-state oscillator whose surface acoustic wave resonator is incorporated in an oscillator loop, and generates a microwave; an amplifier that amplifies the microwave generated by the solid-state oscillator; an isolator that blocks a reflected wave directed from an object exposed with the microwave; a plasma generation unit that controls plasma generation in the chamber by irradiating the microwave to the reaction gas; and an evacuation unit that evacuates the chamber.

This enables generating the microwave using a surface acoustic wave resonator, thereby enabling a size reduction and life cycle increase of a semiconductor manufacturing device. What is more, even if a load impedance varies, the output frequency of the microwave can be stably maintained. Therefore, it becomes possible to reduce the burden on the maintenance of the semiconductor manufacturing device, and to stably generate a plasma in a chamber, thereby increasing the manufacturing quality.

According to a semiconductor manufacturing device of still another aspect of the invention, the surface acoustic wave resonator includes: a thin-film piezoelectric layer placed over a diamond layer or a diamond-like carbon film layer; and an IDT electrode formed on the thin-film piezoelectric layer.

This enables the increase of the propagation speed of surface acoustic wave, thereby allowing oscillation at higher frequencies, making the electrode width of a surface acoustic wave resonator larger compared with other substrate materials, increasing the resistance to electric power, and reducing the frequency fluctuations even with a temperature change. Accordingly, a microwave oscillator source can be implemented with higher precision.

According to a semiconductor manufacturing device in still another aspect of the invention, the surface acoustic wave resonator is provided with: a thin-film piezoelectric layer that is placed over a monocrystalline diamond layer or a hard carbon film having an elastic constant close to that of polycrystalline diamond; an IDT electrode formed on the thin-film piezoelectric layer; and a silicon oxide film formed on the IDT electrode.

With such a configuration, the silicon oxide film becomes able to control temperature compensation with respect to the thin-film piezoelectric layer. This thus helps suppress the frequency fluctuations occurring to a SAW oscillator as a result of temperature variation, thereby stabilizing the microwave output.

Still further, according to a high-frequency heating device in still another aspect of the invention, the configuration further includes: an equal divider that equally divides an electric power in the oscillator loop for output to the outside of the oscillator loop; and a phase shifter that varies the phase in the oscillator loop.

This allows frequency modulation of the microwave. Accordingly, this enables precise control over plasma generation, and peak level reduction of electromagnetic interference.

According to a semiconductor manufacturing device in still another aspect of the invention, the antenna is a unidirectional planar antenna or a phased array antenna.

This favorably reduces the size of the antenna, and thus the chamber can be reduced in size and weight. Moreover, by providing unidirectionality to the antenna, the directivity thereof can be closely matched to the object in the chamber so that the microwave can be irradiated to the object with efficiency.

Using the phased array antenna allows electrical phase control, and thus the directivity can be changed at a high speed. Moreover, in combination with a voltage-control SAW oscillator having a high degree of high-speed modulation, the antenna can afford better control over the high-speed directivity. Accordingly, even if the object temperature is changed rapidly, plasma generation is stabilized and made uniform.

According to a semiconductor manufacturing device in still another aspect of the invention, the configuration includes: a progressive wave/reflected wave detection unit that detects progressive wave power to be directed to the antenna, and reflected wave power to be returned from the antenna; and an operation unit that exercises control over the microwave coming from the antenna based on the progressive wave power and the reflected wave power detected by the progressive wave/reflected wave detection unit.

This configuration enables control to be exercised over the microwave coming from the antenna while monitoring the reflected wave power, which varies depending on the object's position, size, temperature, permittivity, conductivity, and others. Accordingly, factors such as the object's position, size, temperature, permittivity, conductivity, and others are used as a basis to apply power control so as to help plasma generation with efficiency.

According to a semiconductor manufacturing device in still another aspect of the invention, based on the progressive wave power and the reflected wave power detected by the progressive wave/reflected wave detection unit, the operation unit exercises control over at least one of an oscillation frequency of the solid-state oscillator, a presence or absence of an output of the solid-state oscillator, or an amplification level of the amplifier.

In this manner, the progressive wave power and the reflected wave power can be used as a basis to change the amplification level of the amplifier or heat the object. The amplification level is changed so as to maximize the efficiency or minimize the time, and the plasma is excited so as to maximize the efficiency, or minimize the time or power through FSK modulation or ASK modulation applied to the microwave output.

According to a semiconductor manufacturing device in still another aspect of the invention, the configuration further includes a matching unit that is placed at a stage subsequent to the progressive wave/reflected wave detection unit for impedance matching with a load, and the operation unit exercises control over the matching unit based on the progressive wave power and the reflected wave power detected by the progressive wave/reflected wave detection unit.

This enables appropriate adjusting of the impedance matching with the object that is to be exposed with the microwave. As a result, the reflected wave power can be reduced so that the microwave can be absorbed into the object with efficiency.

According to a semiconductor manufacturing device in still another aspect of the invention, the antenna is plurally provided in the chamber, and a power splitter that controls power allocation to the antenna is placed at a stage subsequent to the isolator.

This enables uniform irradiation of the microwave into the metal cavity so that the plasma is generated in a stable manner into every corner of the metal cavity.

According to a light source device in an aspect of the invention, the configuration includes: a solid-state oscillator that generates a microwave; an amplifier that amplifies the microwave generated by the solid-state oscillator; an isolator that is connected to a stage subsequent to the amplifier, and blocks a reflected wave coming from a noble gas exposed with the microwave; a glass tube filled with the noble gas; and an antenna that is placed in the glass tube, and irradiates the microwave toward the noble gas.

This configuration eliminates the need to use a magnetron to generate the high frequency microwave band, and the need to use a filament for light emission. Accordingly, the light intensity and the spectral characteristics can be highly stable for a long period of time, and the reflected wave coming from the object having been exposed with the microwave is prevented from being directed back to the amplifier so that the amplifier is protected from damage.

According to a light source device in another aspect of the invention, the configuration includes: a solid-state oscillator whose surface acoustic wave resonator is incorporated in an oscillator loop for generating a microwave; an amplifier that amplifies the microwave generated by the solid-state oscillator; an isolator connected to a stage subsequent to the amplifier for blocking a reflected wave coming from a noble gas exposed with the microwave; a glass tube filled with the noble gas; and an antenna placed in the glass tube for irradiating the microwave toward the noble gas.

This configuration enables generating the microwave using the surface acoustic wave resonator so that the light source device can be reduced in size and last longer. Even if the load impedance varies, the output frequency of the microwave can be stably maintained. This thus allows reducing the maintenance burden on the light source device, and to achieve stable light emission in the glass tube. Accordingly, the manufacturing quality can be increased.

According to a light source device in still another aspect of the invention, the surface acoustic wave resonator is provided with: a thin-film piezoelectric layer placed over a diamond layer or a diamond-like carbon film layer; and an IDT electrode formed on the thin-film piezoelectric layer.

This enables the increase of the propagation speed of the surface acoustic wave, thereby allowing oscillation at higher frequencies. What is more, the surface-acoustic wave resonator can be increased in electrode width compared with other substrate materials, the resistance to electric power can be increased, and the frequency fluctuations can be reduced even with a temperature change. As a result, the microwave oscillation source is implemented with a higher degree of accuracy.

According to a light source device in still another aspect of the invention, the surface acoustic wave resonator is provided with: a thin-film piezoelectric layer that is placed over a monocrystalline diamond layer or a hard carbon film having an elastic constant close to that of polycrystalline diamond; an IDT electrode formed on the thin-film piezoelectric layer; and a silicon oxide film formed on the IDT electrode.

With such a configuration, the silicon oxide film becomes able to control temperature compensation with respect to the thin-film piezoelectric layer. This thus helps suppress the frequency fluctuations occurring to a SAW oscillator as a result of temperature variation, thereby stabilizing the microwave output.

According to a light source device in still another aspect of the invention, the configuration further includes: an equal divider that equally divides an electric power in the oscillator loop for output to the outside of the oscillator loop; and a phase shifter that varies a phase in the oscillator loop.

This enables frequency modulation of the microwave, thereby allowing precise control over light emission. Moreover, the peak level of electromagnetic radiation can be reduced.

According to a light source device in still another aspect of the invention, the antenna is a unidirectional planar antenna or a phased array antenna.

This favorably reduces the size of the antenna, and thus the chamber can be reduced in size and weight. Moreover, by providing unidirectionality to the antenna, the directivity thereof can be closely matched to the noble gas in the glass tube so that the microwave can be irradiated to the noble gas with efficiency.

Using the phased array antenna allows electrical phase control, and thus the directivity can be changed at a high speed. Moreover, in combination with a voltage-control SAW oscillator having a high degree of high-speed modulation, the antenna can afford better control over the high-speed directivity so that light emission can be stable and uniform.

According to a light source device in still another aspect of the invention, the configuration includes: a progressive wave/reflected wave detection unit that detects progressive wave power to be directed to the antenna, and reflected wave power to be returned from the antenna; and an operation unit that exercises control over the microwave coming from the antenna based on the progressive wave power and the reflected wave power detected by the progressive wave/reflected wave detection unit.

This configuration enables control to be exercised over the microwave coming from the antenna while monitoring the reflected wave power, which varies depending on the noble gas position, temperature, permittivity, conductivity, and others. Accordingly, factors such as noble gas position, temperature, permittivity, conductivity, and others are used as a basis to apply power control in such a manner to achieve light emission with efficiency.

According to a light source device in still another aspect of the invention, based on the progressive wave power and the reflected wave power detected by the progressive wave/reflected wave detection unit, the operation unit exercises control over at least one of an oscillation frequency of the solid-state oscillator, a presence or absence of an output of the solid-state oscillator, or an amplification level of the amplifier.

In this manner, the progressive wave power and the reflected wave power can be used as a basis to change the amplification level of the amplifier so as to maximize the efficiency, or the microwave output is subjected to FSK modulation or ASK modulation to achieve light emission with the maximum efficiency or the minimum power.

According to a light source device in still another aspect of the invention, the configuration further includes a matching unit that is placed at a stage subsequent to the progressive wave/reflected wave detection unit for impedance matching with a load, and the operation unit exercises control over the matching unit based on the progressive wave power and the reflected wave power detected by the progressive wave/reflected wave detection unit.

This enables appropriate adjusting of the impedance matching with the object that is to be exposed with the microwave. As a result, the reflected-wave power can be reduced so that the microwave can be absorbed into the noble gas with efficiency.

According to a light source device in still another aspect of the invention, the antenna is plurally provided in the glass tube, and a power splitter that controls power allocation to the antenna is placed at a stage subsequent to the isolator.

This enables uniform irradiation of the microwave into the glass tube, resulting in stable light emission into every corner of the glass tube.

BRIEF DESCRIPTION OF THE DRAWINGS

The invention will be described with reference to the accompanying drawings, wherein like numbers reference like elements, and wherein.

DESCRIPTION OF EXEMPLARY EMBODIMENTS

Figure 1:
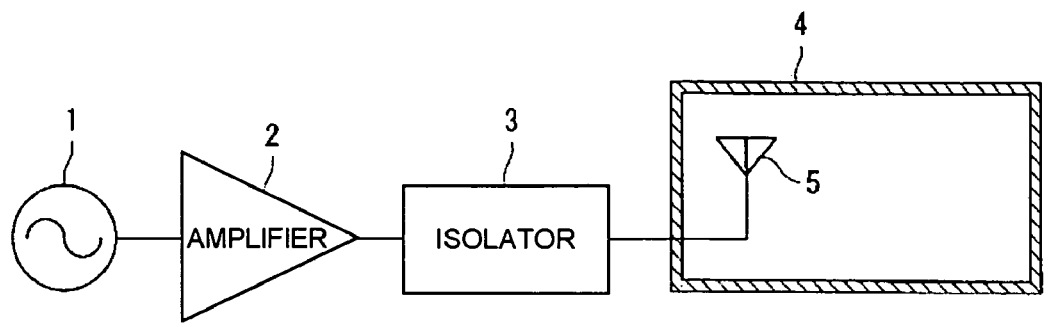
FIG. 1 is a block diagram showing the schematic diagram of a-high-frequency heating device of a first embodiment.

In the description below, a high-frequency heating device and a semiconductor manufacturing device according to embodiments of the present invention are described by referring to the drawings.

FIG. 1 is a block diagram showing the schematic configuration of a high-frequency heating device of a first embodiment of the invention. Note that a specific example of the high-frequency heating device includes a heating unit such as microwave oven or a dryer.

By referring to FIG. 1, the high-frequency heating device is provided with a metal cavity 4, and in the metal cavity 4, an antenna 5 is placed for microwave irradiation. Here, the metal cavity 4 can efficiently trap therein the microwave irradiated from the antenna 5 without leakage to the outside. Note that, the metal cavity 4 can carry therein an object, e.g., a water-absorbing substance or others.

Further, the high-frequency heating device is provided with an oscillator 1 for generating a high frequency microwave band, an amplifier 2 for amplifying the high frequency generated by the oscillator 1, and an isolator 3 for blocking a reflected wave from an object exposed with the microwave. Note that the oscillator 1 can generate a frequency of 2.45 GHz band for heating application using the microwave, and for example, a dielectric oscillator including a resonator made of a piezoelectric ceramics material, or an oscillator made of a single quartz crystal material or a thin-film piezoelectric material such as AlN and ZnO can be used. Moreover, the amplifier 2 is allowed to amplify up to a high-frequency output level of the microwave generated by the oscillator 1 with which water molecules are vibrated. The amplifier 2 is connected to the stage subsequent to the oscillator 1, the isolator 3 is connected to the stage subsequent to the amplifier 2, and the isolator 3 is connected to the antenna 5.

The microwave generated by the oscillator 1 is amplified by the amplifier 2, and then sent out to the antenna 5 via the isolator 3. The microwave sent out to the antenna 5 is then irradiated into the metal cavity 4, and heated by vibrating the water molecules of the substance placed inside of the metal cavity 4.

This enables generating the microwave using the oscillator 1, and thus it becomes possible to generate the high frequency microwave without using electronic tubes such as a magnetron and klystron. Accordingly, there is not only no longer a need to use a filament to generate the microwave but also a high-voltage power supply unit of several kV, a permanent magnet, an electromagnet, a cooling fan for forcefully cooling the anode heated to high temperatures, and others. This thus enables reducing the size of the high-frequency heating device and increases the life cycle thereof, and to control any unwanted emission so that adverse effects can be suppressed with respect to radio communications equipment such as Bluetooth and WLAN used in the ISM band.

What is more, by connecting the isolator 3 to the stage subsequent to the amplifier 2, it becomes possible to prevent the reflected wave generated by variation (difference of placement position, size, material, and others) of the load impedance from returning to the amplifier 2. This protects the amplifier 2 from damage, and suppresses the fluctuation of the output frequency of the microwave, thereby allowing the stable derivation of any needed microwave power, and being maintenance-free.

Figure 2:
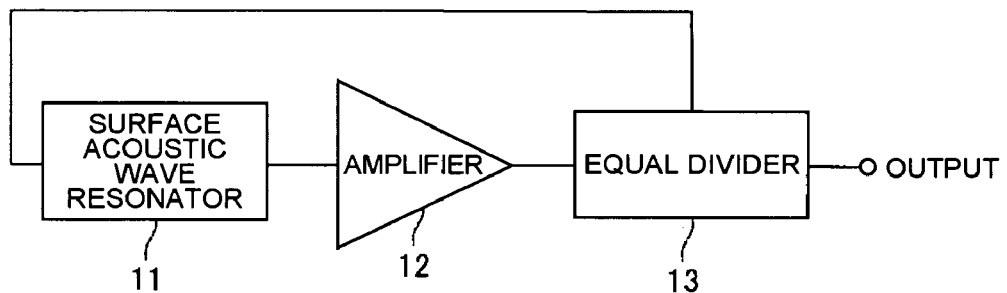
FIG. 2 is a block diagram showing the schematic diagram of a solid-state high-frequency oscillator of a second embodiment.

FIG. 2 is a block diagram showing the schematic configuration of a solid-state high-frequency oscillator according to a second embodiment of the invention.

By referring to FIG. 2, as a feedback circuit of an amplifier 12 for oscillation, a surface acoustic wave resonator 11 is placed in series with an equal divider 13 that equally divides an electric power in the oscillator loop for output to the outside of the oscillator loop. These blocks are connected with matching of a specific characteristics impedance of 50 ohm, for example. Note here that the surface acoustic wave resonator 11 can be connected to the input end of the amplifier 12 so as to receive the input voltage at which the amplifier 12 is saturated.

In such a manner, it becomes possible to generate the microwave using the surface acoustic wave resonator 12, thereby easing direct oscillation in the GHz band, providing low phase noise characteristics, and deriving high-precision high-quality oscillation signals of a base frequency. Therefore, there is no longer a need to use a magnetron to generate a microwave, thereby enabling a size reduction and life cycle increase of the high-frequency heating device, and suppression of unwanted emission so that communications failures can be controlled with respect to radio communications equipment such as Bluetooth and WLAN used in the ISM band.

Furthermore, by connecting the surface acoustic wave resonator 11 to the input end of the amplifier 12 for provision of the input voltage at which the amplifier 12 is saturated, this surface acoustic wave resonator 11 can be placed to the last stage of the feedback circuit of the amplifier 12. With such a configuration, the power applied to the surface acoustic wave resonator 11 can be the minimum necessary, and thus it becomes possible to keep the surface acoustic wave resonator 11 continuously oscillating for a long time. Moreover, by connecting the equal divider 13 to the output end of the amplifier 12, the equal divider 13 becomes able to output the output power of the amplifier 12 directly to the outside so that a large output power can be derived.

Figure 3:
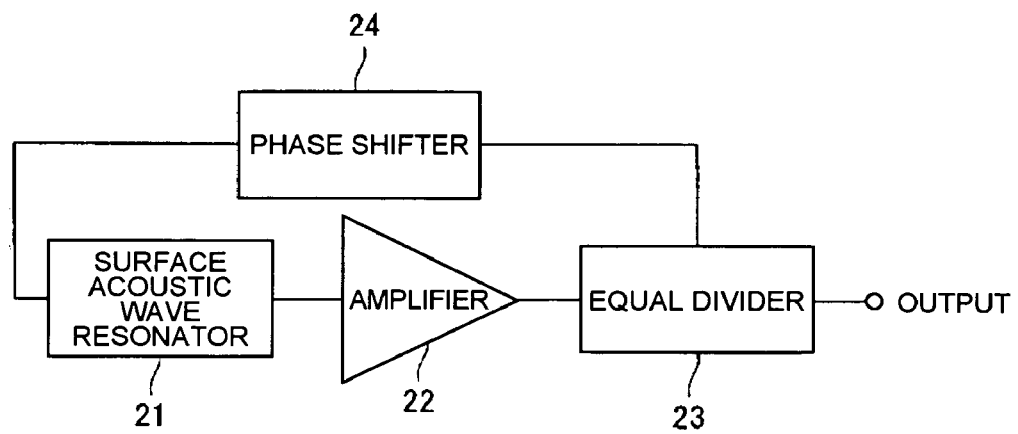
FIG. 3 is a block diagram showing the schematic configuration of a solid-state high-frequency oscillator of a third embodiment.

FIG. 3 is a block diagram showing the schematic configuration of a solid-state high-frequency oscillator according to a third embodiment of the invention.

By referring to FIG. 3, as a feedback circuit of an amplifier 22 for oscillation, a surface acoustic wave resonator 21 is placed in series with an equal divider 23, and a phase shifter 24. The equal divider 23 equally divides an electric power in the oscillator loop for output to the outside of the oscillator loop. The phase shifter 24 receives the control voltage from the outside for varying the phase in the oscillator loop. These blocks are all connected with matching of a specific characteristics impedance of 50 ohm, for example. Note here that the surface acoustic wave resonator 21 can be connected to the input end of the amplifier 22 so as to receive the input voltage at which the amplifier 22 is saturated.

In such a configuration, with the matching maintained, the output power of the amplifier 22 can be output directly to the outside from the equal divider 23, thereby deriving the large output power. Moreover, with such a circuit configuration, an oscillation circuit of a voltage control type can be configured in which the power applied to the surface acoustic wave resonator 21 can be made to keep continuously oscillating for a long time with the power applied thereto is minimized, and a large output power can be derived.

What is more, by incorporating the phase shifter 24 in the oscillator loop, it becomes possible to modulate the frequency of the microwave. Therefore, by configuring the solid-state high-frequency oscillator as a voltage-controlled oscillator, it becomes possible to modulate the frequency of the microwave, and the resulting microwave can be irradiated intermittently or continuously to an object. For example, in a case where the microwave is irradiated intermittently, the intermittent periods can change the average irradiation power, thereby equivalently varying the power strength of the microwave. Therefore, with application to the heating device, the object can be heated uniformly to a greater degree. What is more, by sweeping the control voltage of the voltage-controlled oscillator, the microwave frequency can be changed on a continual basis. For example, by sweeping it using a pseudo random noise signal, a single spectrum (energy) of the oscillator can be spread over a wide frequency range. As a result of such spreading, the electromagnetic interference (EMI) can be reduced in peak level, and the electromagnetic compatibility (EMC) can be improved. As such, the high-frequency heating device using a microwave oscillator source can be operated without affecting radio communications equipment sharing the same frequency band.

Note that, as the phase shifter 24 of FIG. 3, using a –3 dB90° hybrid coupler and a reactance adjustable circuit associated thereto can yield a large shift change with low insertion loss.

Figure 4:
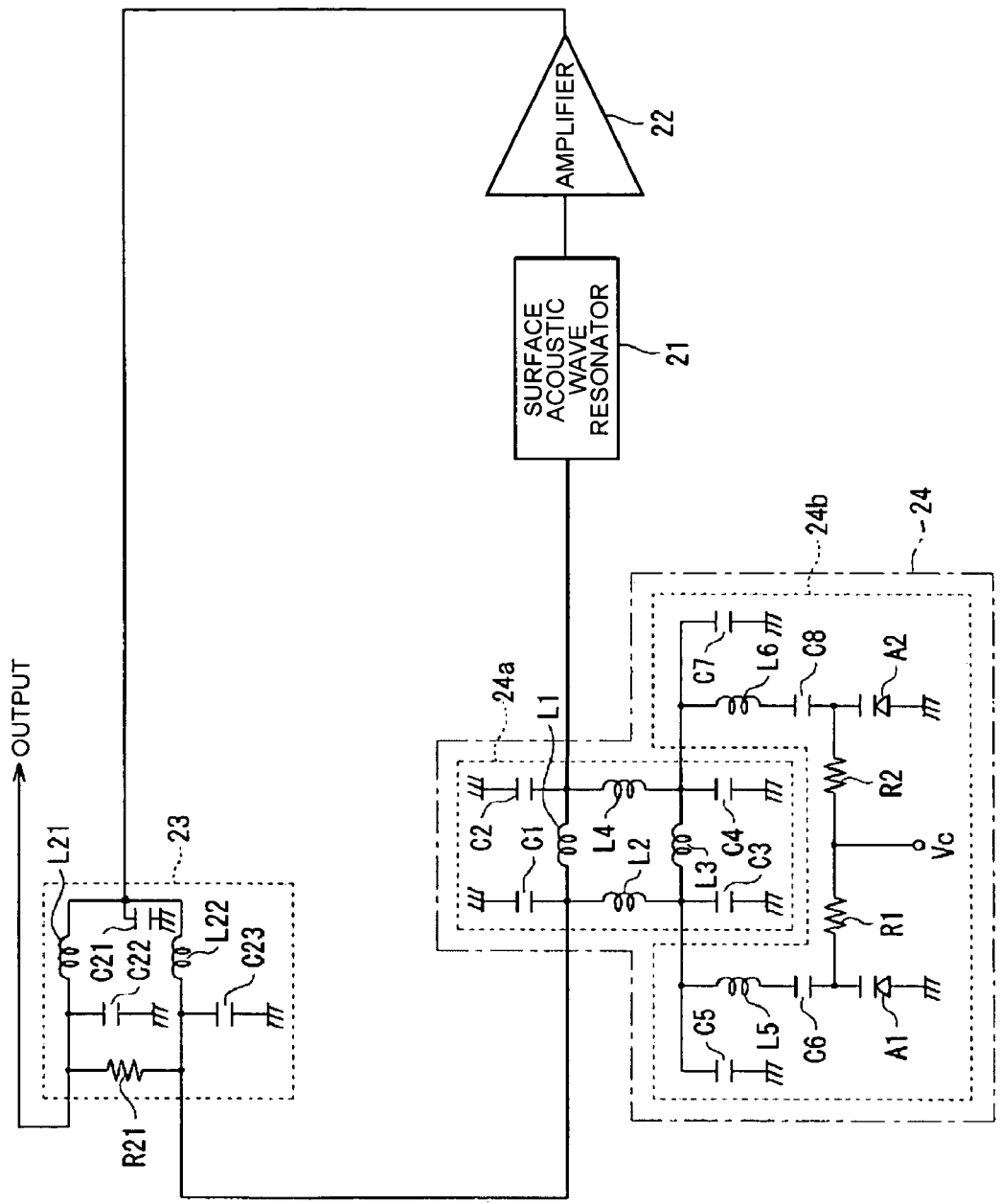
FIG. 4 is a diagram showing an exemplary specific configuration of the solid-state high-frequency oscillator of FIG. 3.

FIG. 4 is a diagram showing an exemplary specific configuration of the solid-state high-frequency oscillator of FIG. 3.

By referring to FIG. 4, the phase shifter 24 is provided with a –3 dB90° hybrid coupler 24a, and an addition control section 24b. Herein, the –3 dB90° hybrid coupler 24a is provided with capacitors C1 to C4 and coils L1 to L4. Therein, the coils L1 to L4 are connected in a loop, and between the coil L1 and the coil L2, the capacitor C1 is connected for connection to the equal divider 2. Between the coil L2 and the coil L3, the capacitor C3 is connected, between the coil L3 and the coil L4, the capacitor C4 is connected, and between the coil L4 and the coil L1, the capacitor C2 is connected for connection to the surface acoustic wave resonator 21.

Further, the addition control section 24b is configured by a reactance adjustable circuit, and is provided with capacitors C5 to C8, coils L5 and L6, resistances R1 and R2, and varactors A1 and A2. Therein, the capacitor C5, the coil L5, the capacitor C6, the resistances R1 and R2, the capacitor C8, the coil L6, and the capacitor C7 are connected in series in order. A terminal between the capacitor C5 and the coil L5 is connected to a terminal between the capacitor C3 and the coil L2 of the –3 dB90° hybrid coupler 24a. A terminal between the capacitor C7 and the coil L6 is connected to a terminal between the capacitor C4 and the coil L4 of the –3 dB90° hybrid coupler 24a. Between the capacitor C6 and the resistance R1, the varactor A1 is connected, between the capacitor C8 and the resistance R2, the varactor A2 is connected, and between the resistance R1 and the resistance R2, an input terminal is provided for the control voltage.

The equal divider 23 serves to equally divide an electric power inside of the oscillator loop for output to the outside of the oscillator loop, and is provided with capacitors C21 to C23, coils L21 and L22, and a resistance R21. Therein, the capacitors C22, the coil L21, the coli L22, and the capacitor C23 are connected in series in this order. Between the coil L21 and the coil L22, the capacitor C21 is connected for connection to the output of the amplifier 22, and between the capacitor C22 and the coil L21, an output terminal of the voltage-controlled oscillator is connected. Between the capacitor C23 and the coil L22, the –3 dB90° hybrid coupler 24a is connected, and between the output terminal of the voltage-controlled oscillator and the –3 dB90° hybrid coupler 24a, the resistance R21 is connected.

Such a configuration allows increasing the variable width of frequency of the voltage-controlled oscillator, thereby enabling the derivation of good frequency-variable characteristics with respect to the control voltage. What is more, with low insertion loss, the circuit loss can also be minimized, thereby implementing a voltage-controlled oscillator suffering from less output variation with a high degree of efficiency. Furthermore, the equal divider 23 equally divides an electric power for output to the outside of the oscillator loop without causing impedance disturbance in the oscillator loop, thereby leading to stable circuit operation with respect to loads.

Figure 5:
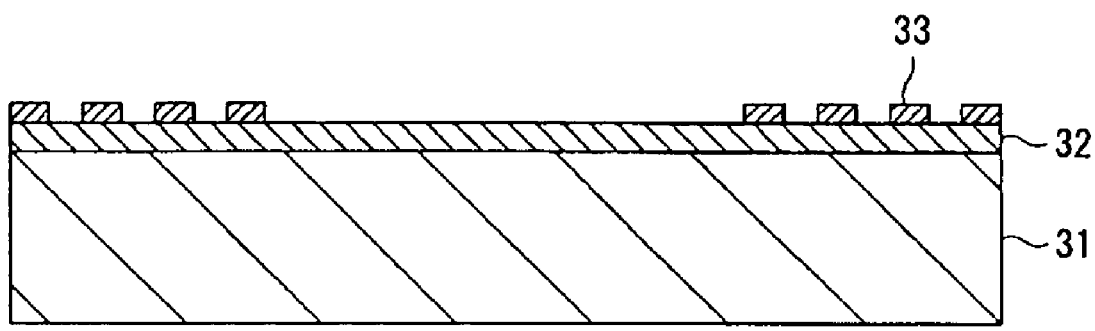
FIG. 5 is a cross sectional diagram showing the schematic configuration of a surface acoustic wave resonator of a fourth embodiment.

FIG. 5 is a cross sectional diagram showing the schematic configuration of a surface acoustic wave resonator according to a fourth embodiment of the invention.

By referring to FIG. 5, on a diamond layer or a diamond-like carbon film layer 31, a thin-film piezoelectric layer 32 is formed. This thin-film piezoelectric layer 32 is provided thereon with an IDT (Inter Digital Transducer) electrode 33 for exciting the surface acoustic wave, and a reflector electrode for reflecting the surface acoustic wave. Note that the thin-film piezoelectric layer 32 can be formed by sputtering, chemical vapor deposition, or others, using ZnO, AlN, Pb(Zr, Ti)O$_2$, or others. Further, the IDT electrode 33 can be configured by a pair of comb electrodes, which are placed so as to engage with each other.

Herein, by forming the IDT electrode 33 on the diamond layer or the diamond-like carbon film layer 31, the propagation speed is increased in the substrate. This accordingly allows oscillation at higher frequencies, and the IDT electrode 33 can be increased in electrode width compared with other substrate materials, thereby improving the resistance to electric power. Moreover, the frequency fluctuations can be reduced with respect to a temperature change, thereby implementing an oscillator source with higher precision.

Figure 6:
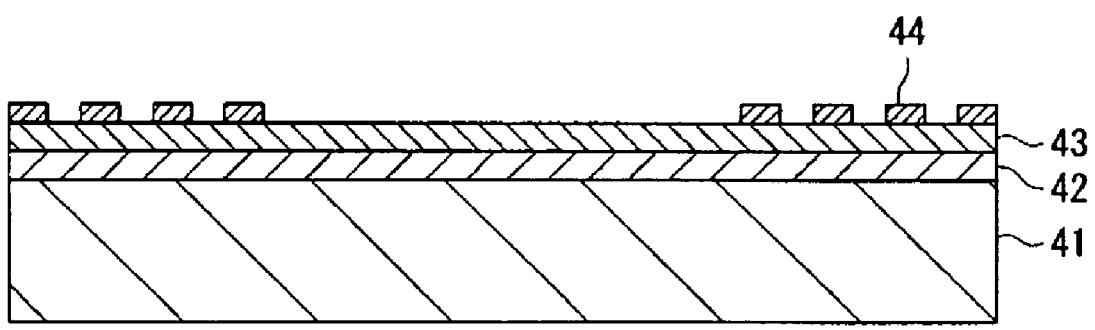
FIG. 6 is a cross sectional diagram showing the schematic configuration of a surface acoustic wave resonator of a fifth embodiment.

FIG. 6 is a cross sectional diagram showing the schematic configuration of a surface acoustic wave resonator according to a fifth embodiment of the present invention.

By referring to FIG. 6, on a diamond layer or a diamond-like carbon film layer 41, a semiconductor diamond layer 42 is placed over, and on the semiconductor diamond layer 42, a thin-film piezoelectric layer 43 is formed. This thin-film piezoelectric layer 43 is provided thereon with an IDT electrode 43 for exciting the surface acoustic wave, and a reflector electrode for reflecting the surface acoustic wave.

Note that the semiconductor diamond layer 42 can be formed with an insulation diamond monocrystal material placed between the diamond layer or the diamond-like carbon film layer 41 and the piezoelectric layer 43, by guiding thereto impurities such as B, Al, P, or S, or interstitial defects by ion implantation and electron exposure. In an alternative manner, the IDT electrode 43 may be formed by the semiconductor diamond layer 42.

Herein, the semiconductor diamond layer 42 can configure a thermistor section. This thus allows detecting the temperature of the surface acoustic wave resonator by the thermistor section. By feeding back the detection result to a temperature stabilizing device, the temperature of the surface acoustic wave resonator can be stabilized. As a result, the frequency fluctuations can be reduced with respect to a temperature change, thereby implementing an oscillation circuit with higher precision.

Figure 7:
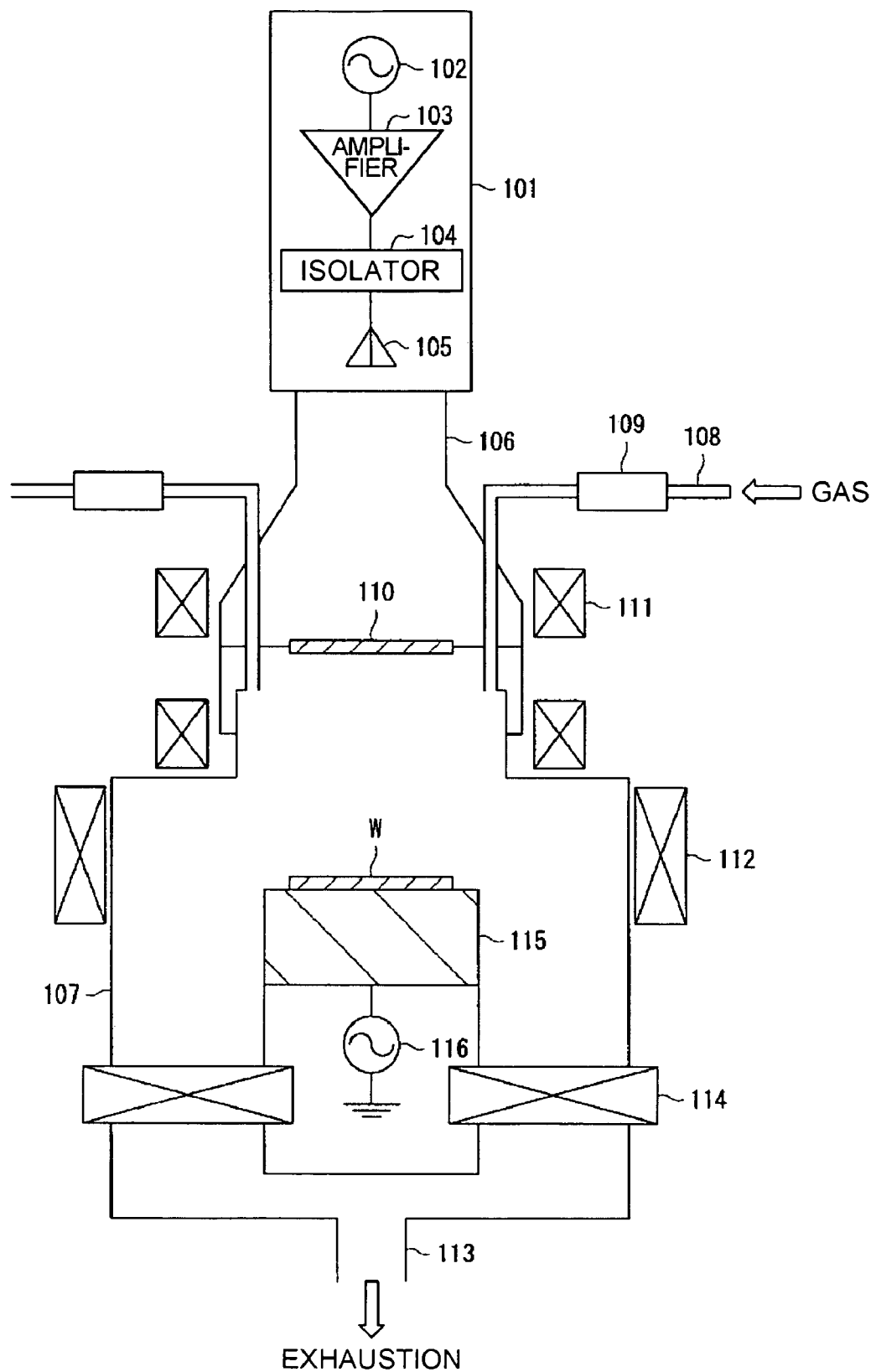
FIG. 7 is a cross sectional diagram showing the schematic configuration of a semiconductor manufacturing device of a sixth embodiment.

FIG. 7 is a cross sectional diagram showing the schematic configuration of a semiconductor manufacturing device according to a sixth embodiment of the invention. Note that, in FIG. 7, the semiconductor manufacturing device is exemplified by a plasma etching device for description.

By referring to FIG. 7, the plasma etching device is provided with a microwave generator 101. Herein, the microwave generator 101 is provided with an oscillator 102 for generating a high frequency microwave band, an amplifier 103 for amplifying the high frequency generated by the oscillator 102, an isolator 104 for blocking a reflected wave directed from an object exposed with the microwave, and an antenna 105 that irradiates the microwave. Here, the oscillator 102 can generate a frequency in the 2.45 GHz band for application of plasma generation using the microwave. Moreover, through gas transition to the high energy level state, the amplifier 103 can amplify the microwave generated in the oscillator 102 by ion-and-electron separation until deriving the plasma state.

Moreover, the plasma etching device is provided with a chamber 107, and the chamber 107 is connected to the microwave generator 101 via a waveguide 106. The waveguide 106 is provided with a microwave guiding window 110 for guiding the microwave to the chamber 107.

Further, the chamber 107 is provided with a placement base 115 for placing thereon a wafer W, and the placement base 115 is connected with an RF power source 116 for application of RF bias. Moreover, the plasma processing device is provided with a waveguide 108 for guiding a reaction gas to the chamber 107, and the waveguide 108 is provided with a gas flow rate controller 109 for controlling the flow rate of the reaction gas.

In the vicinity of the waveguide 106 and the chamber 107, magnetic field generation coils 111 and 112 are provided, respectively, for the purpose of increasing the discharge efficiency. Moreover, the chamber 107 is connected to an evacuation pipe 113 for evacuating the chamber 107. The evacuation path in the chamber 107 is provided with a conductance valve 114 for changing the speed of evacuation.

Once the wafer W is placed on the placement base 115, the chamber 107 is evacuated via the evacuation pipe 113, and when the inside of the chamber 107 reaches a predetermined vacuum level, the reaction gas is guided into the chamber 107 via the waveguide 108.

Thereafter, in the microwave generator 101, a high frequency of 2.45 GHz is generated, and the high frequency of 2.45 GHz generated by the microwave generator 101 is guided through the waveguide 106, and reaches inside of the chamber 107 via the, microwave guiding window 110. Then, by the magnetic field generation coils 111 and 112, the magnetic field is generated in the vicinity of the chamber 107. By electron cyclotron resonance, a high-density plasma is generated in the chamber 107. Thereafter, to the placement base 115, the RF bias is applied by the RF power source 116 so that the wafer W is subjected to an etching process using a plasma gas.

In such a manner, without using a magnetron, it becomes possible to generate a high frequency microwave band. This thus enables a size reduction and life cycle increase of the semiconductor manufacturing device, and prevents the reflected wave directed from an object exposed with the microwave from returning to the amplifier 103 so that the amplifier 103 is protected from damage.

What is more, by including the isolator 104, even if the load impedance varies, the output frequency of the microwave can be stably maintained. Therefore, it becomes possible to reduce the burden on the maintenance of the semiconductor manufacturing device, and to stably generate a plasma in the chamber 107, thereby increasing the manufacturing quality.

Note that, in FIG. 7, exemplified for description is the plasma etching device as a semiconductor manufacturing device. However, the plasma etching device is not the only option, and a plasma CVD device is also an option for application. Moreover, in the above embodiments, exemplified are the high-frequency heating device and the semiconductor manufacturing device. However, applications may be made to the fields of radar equipment, medical equipment, and any other microwave application equipment.

Figure 8:
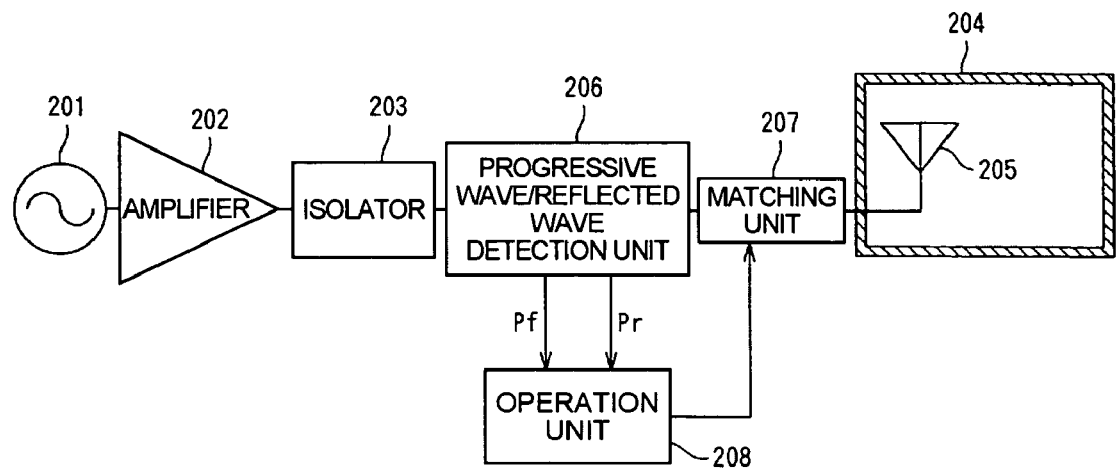
FIG. 8 is a block diagram showing the schematic configuration of a high-frequency heating device of a seventh embodiment.

FIG. 8 is a block diagram showing the schematic configuration of a high-frequency heating device according to a seventh embodiment of the invention.

By referring to FIG. 8, the high-frequency heating device is provided with a metal cavity 204, in which an antenna 205 is placed for microwave irradiation. The high-frequency heating device is also provided with an oscillator 201, an amplifier 202, and an isolator 203. The oscillator 201 generates a high frequency microwave band, and the amplifier 202 amplifies the high frequency generated by the oscillator 201. The isolator 203 blocks a reflected wave coming from an object to be exposed with the microwave. The high-frequency heating device also includes a progressive wave/reflected wave detection unit 206, a matching unit 207, and an operation unit 208. The progressive wave/reflected wave detection unit 206 detects progressive wave power Pf that is directed to the antenna 205, and reflected wave power Pr that is directed back from the antenna 205. The matching unit 207 adjusts the impedance matching with the load. The operation unit 208 exercises control over the matching unit 207 based on the progressive wave power Pf and the reflected wave power Pr, both detected by the progressive wave/reflected wave detection unit 206. Herein, the progressive wave/reflected wave detection unit 206 is exemplified by a directional coupler taking charge of separation between progressive wave and reflected wave.

The amplifier 202 is connected to the stage subsequent to the oscillator 201, and the isolator 203 is connected to the stage subsequent to the amplifier 202. The isolator 203 is connected to the antenna 205 via the progressive wave/reflected wave detection unit 206 and the matching unit 207.

The microwave generated by the oscillator 201 is amplified in the amplifier 202. The amplified microwave is then forwarded to the antenna 205 after going through the isolator 203, the progressive wave/reflected wave detection unit 206, and the matching unit 207. After reaching the antenna 205, the microwave is irradiated into the metal cavity 204, and vibrates water molecules of a substance placed in the metal cavity 204 so that the substance is heated. At this time, the progressive wave power Pf to be directed to the antenna 205 and the reflected wave power Pr to be directed back from the antenna 205 are both detected by the progressive wave/reflected wave detection unit 206. Based on the progressive wave power Pf and the reflected wave power Pr thus detected by the progressive wave/reflected wave detection unit 206, the operation unit 208 can exercise control over the matching unit 207 in such a manner that the impedance matching is appropriately adjusted with the object substance to be exposed with the microwave.

This enables appropriate adjusting of the impedance matching with the object that is to be exposed with the microwave. As a result, the reflected wave power Pr directed from the object can be reduced so that the microwave can be absorbed into the object with efficiency.

Figure 9:
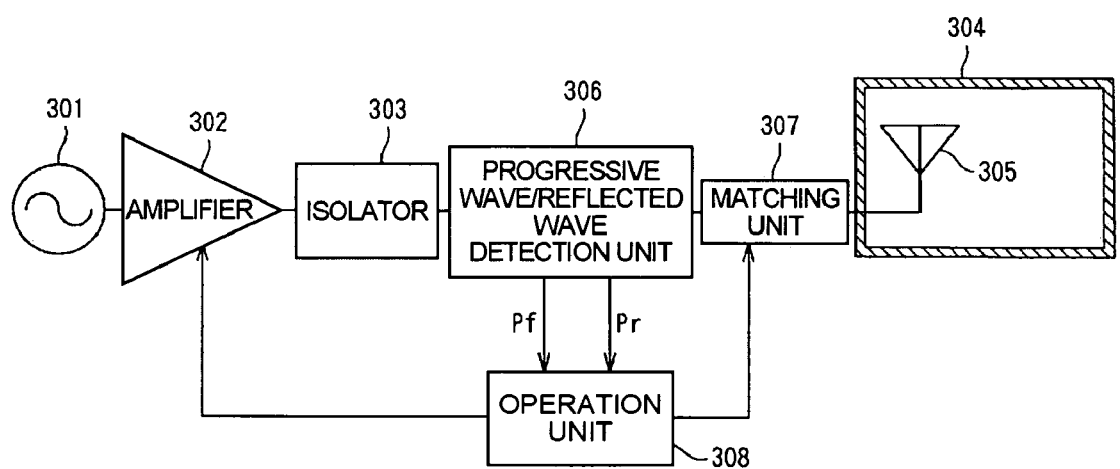
FIG. 9 is a block diagram showing the schematic configuration of a high-frequency heating device of an eighth embodiment.

FIG. 9 is a block diagram showing the schematic configuration of a high-frequency heating device according to an eighth embodiment of the invention.

By referring to FIG. 9, the high-frequency heating device is provided with a metal cavity 304, in which an antenna 305 is placed for microwave irradiation. The high-frequency heating device is also provided with an oscillator 301, an amplifier 302, and an isolator 303. The oscillator 301 generates a high frequency microwave band, and the amplifier 302 amplifies the high frequency generated by the oscillator 301. The isolator 303 blocks a reflected wave coming from an object to be exposed with the microwave. The high-frequency heating device also includes a progressive wave/reflected wave detection unit 306, a matching unit 307, and an operation unit 308. The progressive wave/reflected wave detection unit 306 detects progressive wave power. Pf that is directed to the antenna 305, and reflected wave power Pr that is directed back from the antenna 305. The matching unit 307 adjusts the impedance matching with the load. The operation unit 308 exercises control over the amplifier 302 and the matching unit 307 based on the progressive wave power Pf and the reflected wave power Pr, both detected by the progressive wave/reflected wave detection unit 306.

At this time, the progressive wave power Pf to be directed to the antenna 305 and the reflected wave power Pr to be directed back from the antenna 305 are both detected by the progressive wave/reflected wave detection unit 306. Based on the progressive wave power Pf and the reflected wave power Pr thus detected by the progressive wave/reflected wave detection unit 306, the operation unit 308 can exercise control over the matching unit 307 in such a manner that the impedance matching is appropriately adjusted with the object substance to be exposed with the microwave, and over the amplification level of the amplifier 302 in such a manner that the object can absorb the microwave with efficiency.

This configuration enables control to be exercised over the microwave coming from the antenna while monitoring the reflected wave power Pr, which varies depending on the object's position, object's size, temperature, permittivity, conductivity, and others. Accordingly, factors such as object's position, size, temperature, permittivity, conductivity, and others are used as a basis to apply power control so as to help the object to absorb the microwave with efficiency. As such, the object can be heated while measures are taken to ensure power conservation and short time operation.

Figure 10:
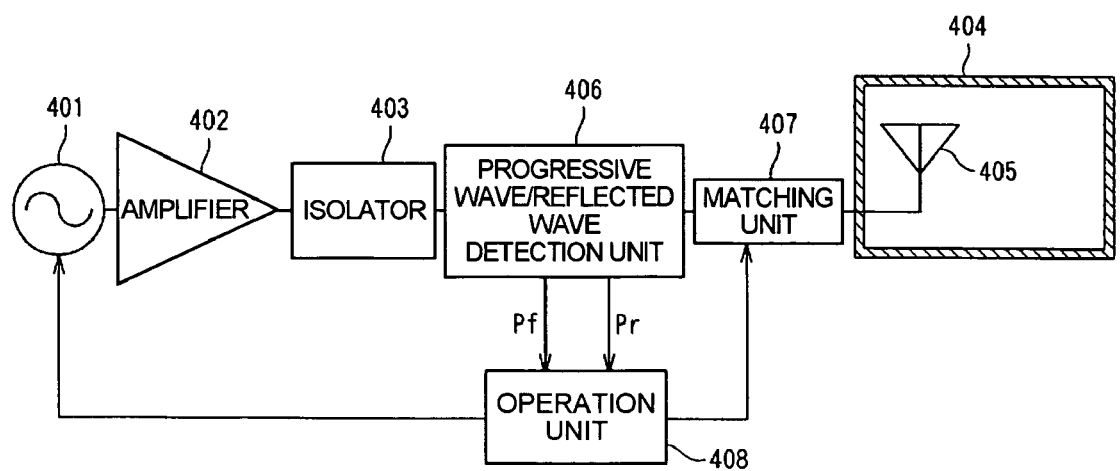
FIG. 10 is a block diagram showing the schematic configuration of a high-frequency heating device of a ninth embodiment.

FIG. 10 is a block diagram showing the schematic configuration of a high-frequency heating device according to a ninth embodiment of the invention.

By referring to FIG. 10, the high-frequency heating device is provided with a metal cavity 404, in which an antenna 405 is placed for microwave irradiation. The high-frequency heating device is also provided with an oscillator 401, an amplifier 402, and an isolator 403. The oscillator 401 generates a high frequency microwave band, and the amplifier 402 amplifies the high frequency generated by the oscillator 401. The isolator 403 blocks a reflected wave coming from an object to be exposed with the microwave. The high-frequency heating device also includes a progressive wave/reflected wave detection unit 406, a matching unit 407, and an operation unit 408. The progressive wave/reflected wave detection unit 406 detects progressive wave power Pf that is directed to the antenna 405, and reflected wave power Pr that is directed back from the antenna 405. The matching unit 407 adjusts the impedance matching with the load. The operation unit 408 exercises control over oscillator 401 and the matching unit 407 based on the progressive wave power Pf and the reflected wave power Pr, both detected by the progressive wave/reflected wave detection unit 406.

At this time, the progressive wave power Pf to be directed to the antenna 405 and the reflected wave power Pr to be directed back from the antenna 405 are both detected by the progressive wave/reflected wave detection unit 406. Based on the progressive wave power Pf and the reflected wave power Pr thus detected by the progressive wave/reflected wave detection unit 406, the operation unit 408 can exercise control over the matching unit 407 in such a manner that the impedance matching is appropriately adjusted with the object substance to be exposed with the microwave, and over the oscillation frequency of the oscillator 401 in such a manner so as to achieve the maximum efficiency, or the minimum time or power.

Figure 11:
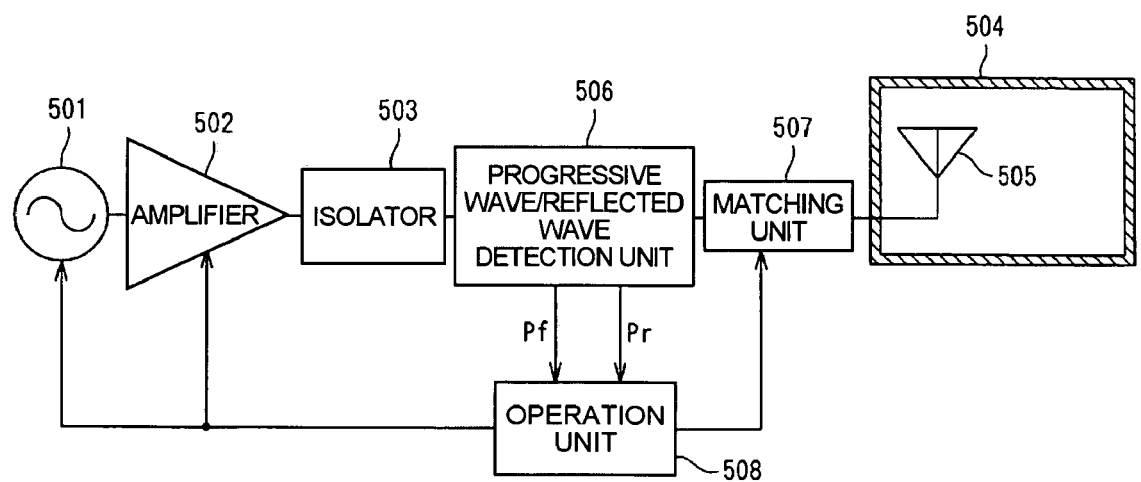
FIG. 11 is a block diagram showing the schematic configuration of a high-frequency heating device of a tenth embodiment.

FIG. 11 is a block diagram showing the schematic configuration of a high-frequency heating device according to a tenth embodiment of the invention.

By referring to FIG. 11, the high-frequency heating device is provided with a metal cavity 504, in which an antenna 505 is placed for microwave irradiation. The high-frequency heating device is also provided with an oscillator 501, an amplifier 502, and an isolator 503. The oscillator 501 generates a high frequency microwave band, and the amplifier 502 amplifies the high frequency generated by the oscillator 501. The isolator 503 blocks a reflected wave coming from an object to be exposed with the microwave. The high-frequency heating device also includes a progressive wave/reflected wave detection unit 506 a matching unit 507, and an operation unit 508. The progressive wave/reflected wave detection unit 506 detects progressive wave power Pf that is directed to the antenna 505, and reflected wave power Pr that is directed back from the antenna 505. The matching unit 507 adjusts the impedance matching with the load. The operation unit 508 exercises control over the oscillator 501, the amplifier 502, and the matching unit 507 based on the progressive wave power Pf and the reflected wave power Pr, both detected by the progressive wave/reflected wave detection unit 506.

At this time, the progressive wave power Pf to be directed to the antenna 505 and the reflected wave power Pr to be directed back from the antenna 505 are both detected by the progressive wave/reflected wave detection unit 506. Based on the progressive wave power Pf and the reflected wave power Pr thus detected by the progressive wave/reflected wave detection unit 506, the operation unit 508 can exercise control over the matching unit 507 in such a manner that the impedance matching is appropriately adjusted with the object substance to be exposed with the microwave. The operation unit 508 is also in charge of changing the amplification level of the amplifier 502 in such a manner as to maximize the efficiency or minimize the time, or controlling the oscillation frequency of the oscillator 501 in such a manner as to maximize the efficiency, or minimize the time or power.

Figure 12:
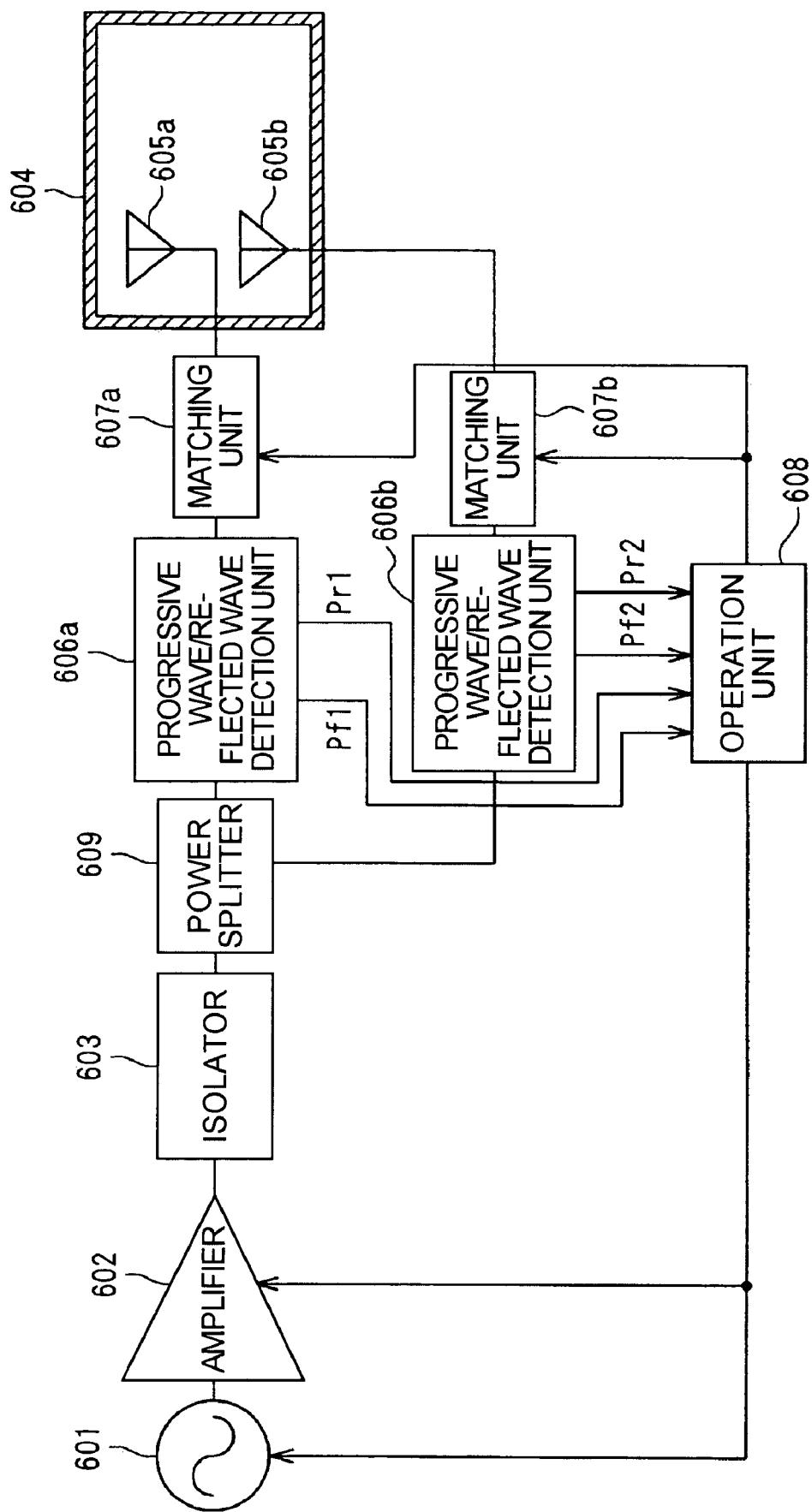
FIG. 12 is a block diagram showing the schematic configuration of a high-frequency heating device of an eleventh embodiment.

FIG. 12 is a block diagram showing the schematic configuration of a high-frequency heating device according to an eleventh embodiment of the invention.

By referring to FIG. 12, the high-frequency heating device is provided with a metal cavity 604, in which antennas 605a and 605b are placed for microwave irradiation. The high-frequency heating device is also provided with an oscillator 601, an amplifier 602, and an isolator 603. The oscillator 601 generates a high frequency microwave band, and the amplifier 602 amplifies the high frequency generated by the oscillator 601. The isolator 603 blocks a reflected wave coming from an object to be exposed with the microwave. The high-frequency heating device also includes progressive wave/reflected wave detection units 606a and 606b, matching units 607a and 607b, and an operation unit 608. The progressive wave/reflected wave detection units 606a and 606b respectively detect progressive wave power Pf1 and Pf2 that are directed to the corresponding antenna 605a or 605b, and reflected wave powers Pr1 and Pr2 that are directed back from the corresponding antenna 605a or 605b. The matching units 607a and 607b both adjust the impedance matching with the load of being exposed with the microwave coming from the antennas 605a and 605b. The operation unit 608 exercises control over the oscillator 601, the amplifier 602, and the matching units 607a and 607b based on the progressive wave powers Pf1 and Pf2, and the reflected wave powers Pr1 and Pr2, detected by the corresponding progressive wave/reflected wave detection unit 606a or 606b. A power splitter 609 that controls power allocation to the antennas 605a and 605b is provided to the stage subsequent to the isolator 603.

At this time, the progressive wave powers Pf1 and Pf2 to be directed to the antennas 605a and 605b and the reflected wave powers Pr1 and Pr2 to be directed back from the antennas 605a and 605b are detected by the corresponding progressive wave/reflected wave detection unit 606a or 606b. Based on the progressive wave powers Pf1 and Pf2, and the reflected wave powers Pr1 and Pr2 detected by the progressive wave/reflected wave detection units 606a and 606b, the operation units 608 can exercise control over the matching units 607a and 607b in such a manner that the impedance matching is appropriately adjusted with the object to be exposed with the microwave. The operation unit 608 also in charge of changing the amplification level of the amplifier 602 in such a manner as to maximize the efficiency or minimize the time, or controlling the oscillation frequency of the oscillator 601 in such a manner as to maximize the efficiency, or minimize the time or power.

By including the power splitter 609 controlling the power allocation to the antennas 605a and 605b, the microwave can be uniformly irradiated into the metal cavity 604 so that the object can be uniformly heated to a greater degree.

Herein, the antennas 5, 105, 205, 305, 405, 505, 605a, and 605b are preferably a unidirectional planar antenna, e.g., patch antenna or slot antenna, or a phased array antenna.

Figure 13:
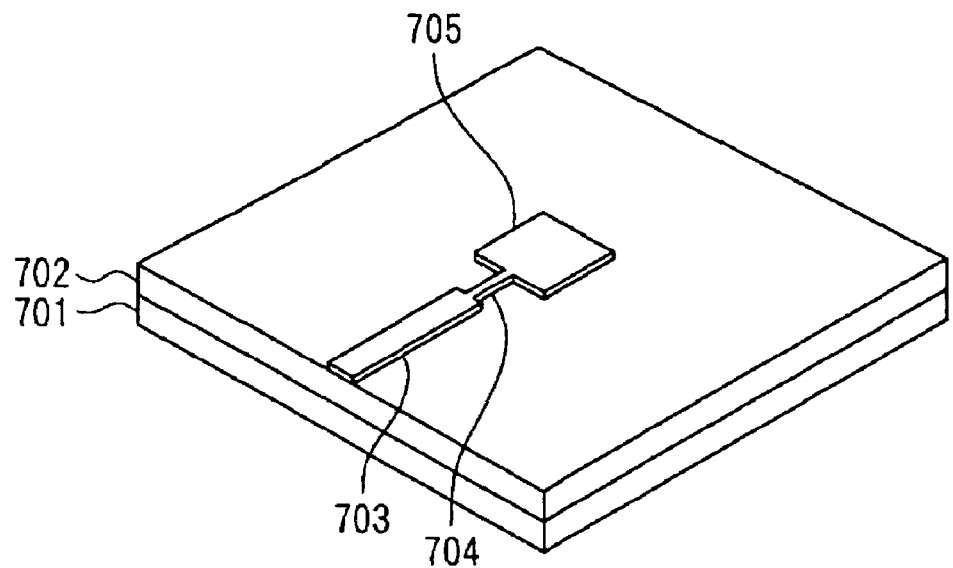
FIG. 13 is a perspective view showing the schematic configuration of a single patch antenna to be applied to the invention.

FIG. 13 is a perspective view showing the schematic configuration of a single patch antenna to be applied to the invention.

Referring to FIG. 13, a dielectric material 702 is formed thereon with conductor patterns 703 to 705, and the underside thereof is formed with a conductor layer 701. Herein, the conductor patterns 703 to 705 can configure a microstrip line. The conductor pattern 705 configures a planar antenna, and with length and width adjustment for the conductor patterns 703 and 704, the impedance matching can be achieved.

This configuration favorably reduces the size of the antennas 5, 105, 205, 305, 405, 505, 605a, and 605b for use with high-frequency heating devices, and the antenna 105 for use with semiconductor manufacturing devices. The configuration also reduces the size and weight of the metal cavities 4, 204, 304, 404, 504, and 604, and the chamber 101. Moreover, by providing the unidirectivity to the antennas 5, 205, 305, 405, 505, 605a, and 605b for use with high-frequency heating devices, and the antenna 105 for use with semiconductor manufacturing device, the directivity thereof can be closely matched to the object in the metal cavities 4, 204, 304, 404, 504, and 604, and in the chamber 101, thereby enabling efficient microwave irradiation to the object.

Figure 14:
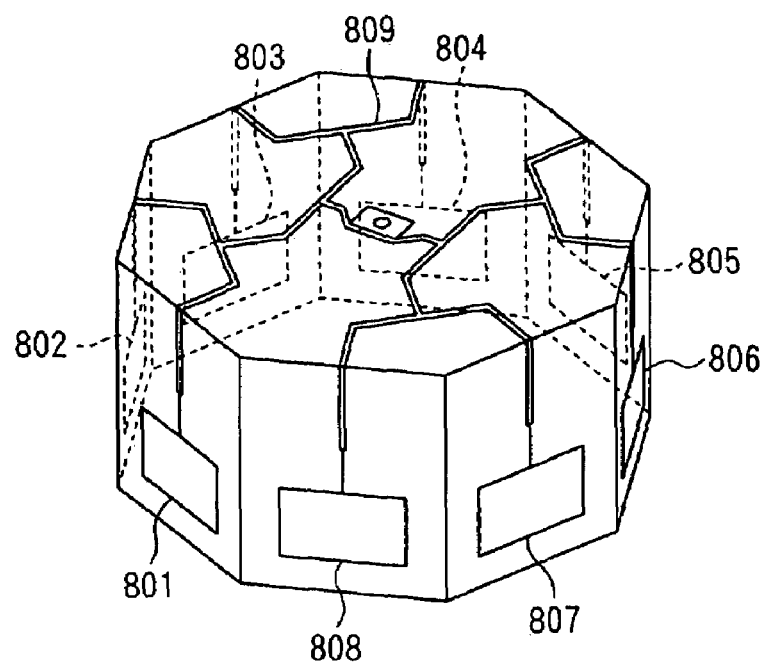
FIG. 14 is a perspective view showing the schematic configuration of a complex patch antenna to be applied to the invention.

FIG. 14 is a perspective view showing the schematic configuration of a complex patch antenna to be applied to the invention.

Referring to FIG. 14, single patch antennas 801 to 808 are so placed as to configure an octagonal column. The single patch antennas 801 to 808 are connected together via a wiring pattern 809. Note here that such single patch antennas 801 to 808 are each exemplified by the single patch antenna of FIG. 13.

With such antenna configuration, the microwave can be directed centrally so that the object can be exposed with the microwave with efficiency.

Figure 15:
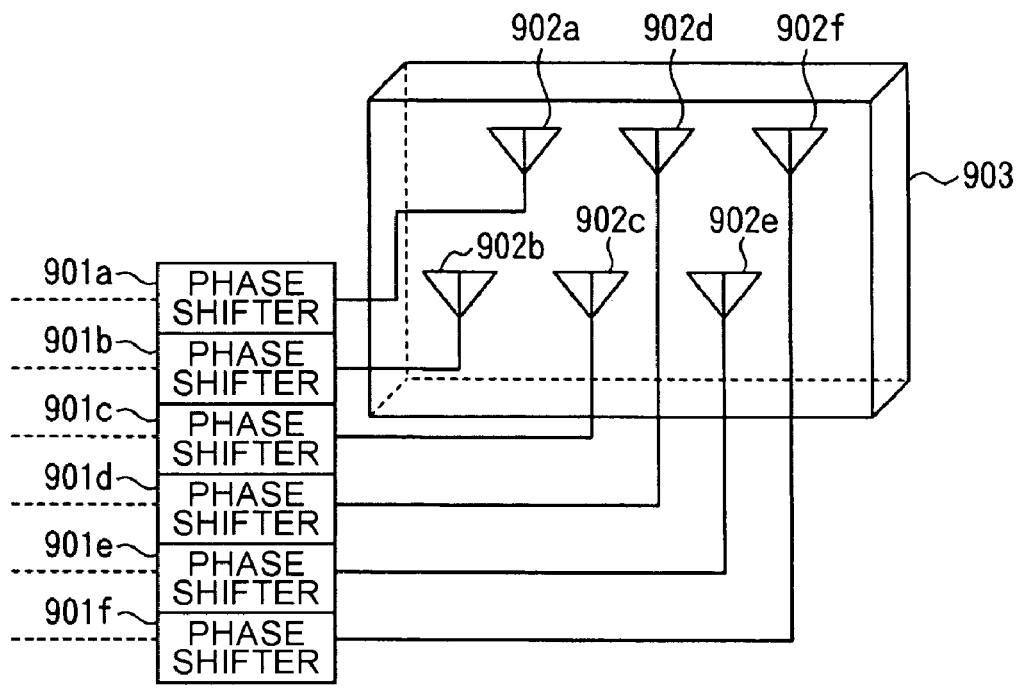
FIG. 15 is a diagram showing the schematic configuration of a phased array antenna to be applied to the invention.

FIG. 15 is a diagram showing the schematic configuration of a phased array antenna to be applied to the invention.

Referring to FIG. 15, a metal cavity 903 carries therein a plurality of antennas 902a to 902f for microwave irradiation. The antennas 902a to 902f are connected with phase shifters 901 to 901f, respectively.

The phase shifters 901a to 901f are in charge of adjusting the progressive power by phase before transmission to the antennas 902a to 902f, thereby controlling the directivity of the microwave. As a result, the microwave can be directed in the direction of the object, or the microwave can be available for scanning. Moreover, using the phased array antenna allows electrical phase control, and thus the directivity can be changed at a high speed. Moreover, in combination with a voltage-control SAW oscillator having a high degree of high-speed modulation, the antenna can afford better control over the high-speed directivity so that the temperature-varying object can be heated as appropriate, and plasma generation can be controlled in the right place at the right time.

As an alternative configuration, the antenna 902a to 902f may take one-dimensional or two-dimensional configuration for placement. Assuming that the antennas 902a to 902f are arranged two-dimensionally, the microwave can be changed in directivity on a two-dimensional plane, right and left and top and bottom.

Figure 16:
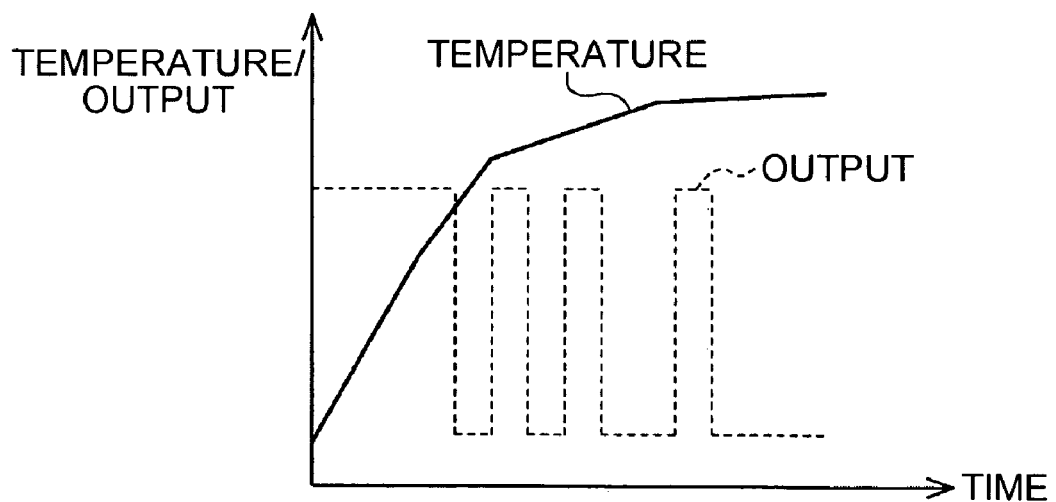
FIG. 16 is a diagram showing a modulation method for a microwave output according to an embodiment of the invention.

FIG. 16 is a diagram showing a modulation method for a microwave output according to an embodiment of the invention.

Referring to FIG. 16, in a case of controlling the microwave output for irradiation to the object, the microwave output can be subjected to FSK modulation or ASK modulation so as to minimize the reflected wave power, or the oscillation output can be subjected to On/Off control. As a result, the amplification level is changed so as to maximize the efficiency or minimize the time, and the object is so heated as to maximize the efficiency, or minimize the time or power through. FSK modulation or ASK modulation applied to the microwave output.

Figure 17:
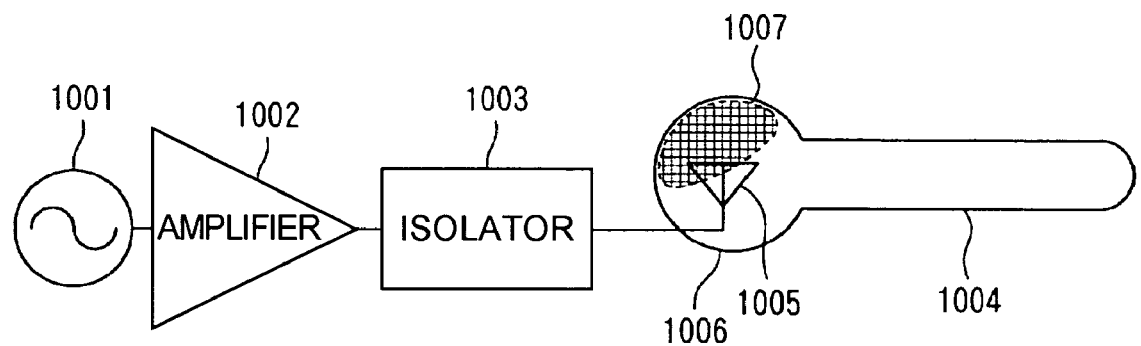
FIG. 17 is a block diagram showing the schematic configuration of a light source device according to a twelfth embodiment.

FIG. 17 is a block diagram showing the schematic configuration of a light source device according to a twelfth embodiment of the invention.

Referring to FIG. 17, the light source device is provided with a glass tube 1004 with a bulging portion 1006, in which an antenna 1005 is placed for microwave irradiation. The light source device is also provided with a metal mesh 1007 along the surface of the bulging portion 1006 for reflecting the microwave coming from the antenna 1005. Here, the glass tube 1004 can be filled with a noble gas such as argon gas, neon gas, halogen gas, xenon gas, or others.

The light source device is also provided with an oscillator 1001, an amplifier 1002, and an isolator 1003. The oscillator 1001 generates a high frequency microwave band, and the amplifier 1002 amplifies the high frequency generated by the oscillator 1001. The isolator 1003 blocks a reflected wave coming from an object to be exposed with the microwave. The amplifier 1002 is connected to the stage subsequent to the oscillator 1001, and the isolator 1003 is connected to the stage subsequent to the amplifier 1002. The isolator 1003 is connected to the antenna 1005.

The microwave generated by the oscillator 1001 is amplified by the amplifier 1002. The amplified microwave is then forwarded to the antenna 1005 after going through the isolator 1003. After reaching the antenna 1005, the microwave is irradiated into the glass tube 1004, and excites the noble gas filled in the glass tube 1004 for light emission.

This configuration eliminates the need to use a magnetron to generate the high frequency microwave band, and the need to use a filament for light emission. Accordingly, the light intensity and the spectral characteristics can be highly stable for a long period of time, and the reflected wave coming from the object having been exposed with the microwave is prevented from being directed back to the amplifier so that the amplifier is protected from damage.

Note that the light source device of FIG. 17 is applicable to luminaries for air-traffic control that are expected to be highly reliable, luminaries for steel towers, railroad bridges, tunnels or others that are difficult to maintain, vehicle headlights or headlamps for aerospace use that are supposed to withstand large acceleration forces and vibrations, light sources for ultraviolet sterilization, variable-flash-at-a-high-speed displays for general types of moving images, or others.

The antenna 1005 of FIG. 17 may be the single patch antenna of FIG. 13, the complex patch antenna of FIG. 14, or the phased array antenna of FIG. 15. Moreover, the configurations of FIGS. 8 to 12 may be applied to the light source device of FIG. 17. The oscillator 1001 may be the SAW oscillator of FIG. 5, 6, or 18.

Figure 18:
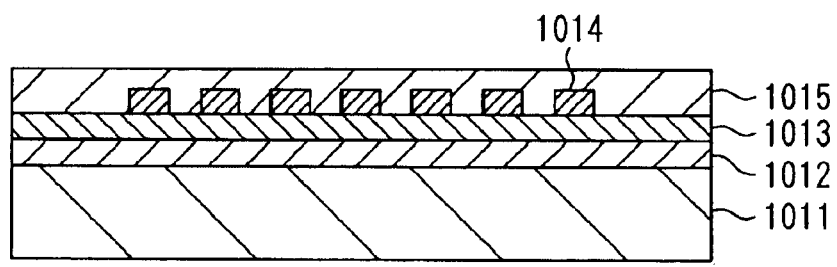
FIG. 18 is a cross sectional view showing the schematic configuration of a surface acoustic wave resonator according to a thirteenth embodiment.

FIG. 18 is a cross sectional diagram showing the schematic configuration of a surface acoustic wave resonator according to a thirteenth embodiment of the invention.

Referring to FIG. 18, a silicon substrate 1011 is formed thereon with a diamond layer 1012, and on the diamond layer 1012, a ZnO film 1013 is formed. The diamond layer 1012 may be of monocrystalline or polycrystalline, or a hard carbon film having an elastic constant close to that of the diamond layer 1012 may be used as an alternative to the diamond layer 1012. The ZnO film 1013 is formed thereon with an IDT electrode 1014 for excitation of the surface acoustic wave, and a reflector electrode for reflection of the surface acoustic wave. On the ZnO film 1013, an SiO$_2$ film 1015 is so placed as to cover the IDT electrode 1014.

With such a configuration, the SiO$_2$ layer 1015 becomes able to control temperature compensation with respect to the ZnO film 1013. This thus helps suppress the frequency fluctuations occurring to a SAW oscillator as a result of temperature variation, thereby stabilizing the microwave output.

What is claimed is:

1. A light source device, comprising:
a solid-state oscillator that generates a microwave;
an amplifier that amplifies the microwave generated by the solid-state oscillator;
an isolator that is connected to a stage subsequent to the amplifier, the isolator blocking a reflected wave coming from a noble gas exposed with the microwave;
a glass tube filled with the noble gas and spaced apart and separated from each of the oscillator, the amplifier, and the isolator, the glass tube including a bulging portion having a metal mesh; and
an antenna that is placed in the bulging portion of the glass tube, and irradiates the microwave toward the noble gas;
wherein the isolator is disposed between the amplifier and the glass tube.

2. The light source device of claim 1, wherein:
the solid-state oscillator includes a surface acoustic wave resonator incorporated in an oscillator loop.

3. The light source device according to claim 2, wherein the surface acoustic wave resonator includes:
a thin-film piezoelectric layer placed over a diamond layer or over a carbon film layer having an elastic constant substantially equal to that of polycrystalline diamond; and
an IDT electrode formed on the thin-film piezoelectric layer.

4. The light source device according to claim 2, wherein the surface acoustic wave resonator includes:
a thin-film piezoelectric layer placed over a monocrystalline diamond layer or a hard carbon film having an elastic constant close to that of polycrystalline diamond;
an IDT electrode formed on the thin-film piezoelectric layer; and
a silicon oxide film formed on the IDT electrode.

5. The light source device according to claim 2, further comprising:
an equal divider that equally divides an electric power in the oscillator loop for output to an outside of the oscillator loop; and
a phase shifter that varies a phase in the oscillator loop.

6. The light source device according to claim 1, wherein the antenna is a unidirectional planar antenna or a phased array antenna.

7. The light source device according to claim 1, further comprising:
a progressive wave/reflected wave detection unit that detects progressive wave power to be directed to the antenna, and reflected wave power to be returned from the antenna; and
an operation unit that exercises control over the microwave coming from the antenna based on the progressive wave power and the reflected wave power detected by the progressive wave/reflected wave detection unit.

8. The light source device according to claim 7, wherein based on the progressive wave power and the reflected wave power detected by the progressive wave/reflected wave detection unit, the operation unit exercises control over at least one of an oscillation frequency of the solid-state oscillator, a presence or absence of an output of the solid-state oscillator, or an amplification level of the amplifier.

9. The light source device according to claim 7, further comprising a matching unit that is placed at a stage subsequent to the progressive wave/reflected wave detection unit for impedance matching with a load, wherein
the operation unit exercises control over the matching unit based on the progressive wave power and the reflected wave power detected by the progressive wave/reflected wave detection unit.

10. The light source device according to claim 1, wherein the antenna is plurally provided in the glass tube, and
a power splitter that controls power allocation to the antenna is placed at a stage subsequent to the isolator.

* * * * *